(12) United States Patent
Yun et al.

(10) Patent No.: US 8,379,311 B2
(45) Date of Patent: Feb. 19, 2013

(54) METHOD FOR FABRICATING MICRO-LENS, AND MICRO-LENS ARRAY INCLUDING THE MICRO-LENS

(75) Inventors: Young Je Yun, Seoul (KR); Jin Ho Park, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/163,159

(22) Filed: Jun. 17, 2011

(65) Prior Publication Data
US 2012/0140332 A1   Jun. 7, 2012

(30) Foreign Application Priority Data
Dec. 1, 2010 (KR) .................. 10-2010-0121266

(51) Int. Cl.
   *G02B 27/00* (2006.01)
   *C03C 25/68* (2006.01)
   *G03F 1/00* (2012.01)
(52) U.S. Cl. ........ 359/619; 359/620; 359/621; 359/622; 359/623; 359/624; 216/41; 216/45; 216/46; 216/47; 216/48; 430/4; 430/320; 430/321
(58) Field of Classification Search .................. 359/619
   See application file for complete search history.

(56) References Cited

U.S. PATENT DOCUMENTS

| 6,301,051 | B1 | 10/2001 | Sankur | |
| 2008/0290383 | A1* | 11/2008 | Dunne et al. | 257/292 |
| 2008/0316607 | A1* | 12/2008 | Park | 359/642 |
| 2009/0092934 | A1* | 4/2009 | Christophersen et al. | 430/325 |

FOREIGN PATENT DOCUMENTS

| JP | 2010-191001 | 9/2010 |
| KR | 10-2002-0035485 A | 5/2002 |
| KR | 10-2009-0054157 A | 5/2009 |

* cited by examiner

*Primary Examiner* — Scott J Sugarman
*Assistant Examiner* — Robert E Tallman
(74) *Attorney, Agent, or Firm* — Sherr & Jiang, PLLC

(57) ABSTRACT

A micro-lens array and a method for fabricating a micro-lens includes forming a first lens formation material layer on and/or over a micro-lens formation area of a semiconductor substrate, and then forming a portion of the lens formation material layer as a first micro-lens using a first mask. A second lens formation material layer is formed adjacent to the first micro-lens on and/or over the micro-lens formation area. The second lens formation material layer is also formed as a second micro-lens using a second mask which is a different type from that of the first mask.

17 Claims, 18 Drawing Sheets

1st GRAY-TONE MASK PHOTO
400

2nd GRAY-TONE MASK PHOTO
402

ZERO-GAP

1st MICRO-LENS PHOTO

⇩

1st MICRO-LENS THERMAL REFLOW

⇩

2nd MICRO-LENS PHOTO

⇩

2nd MICRO-LENS THERMAL REFLOW

ZERO-GAP

1st GRAY-TONE MASK PHOTO

2nd GRAY-TONE MASK PHOTO

ZERO-GAP

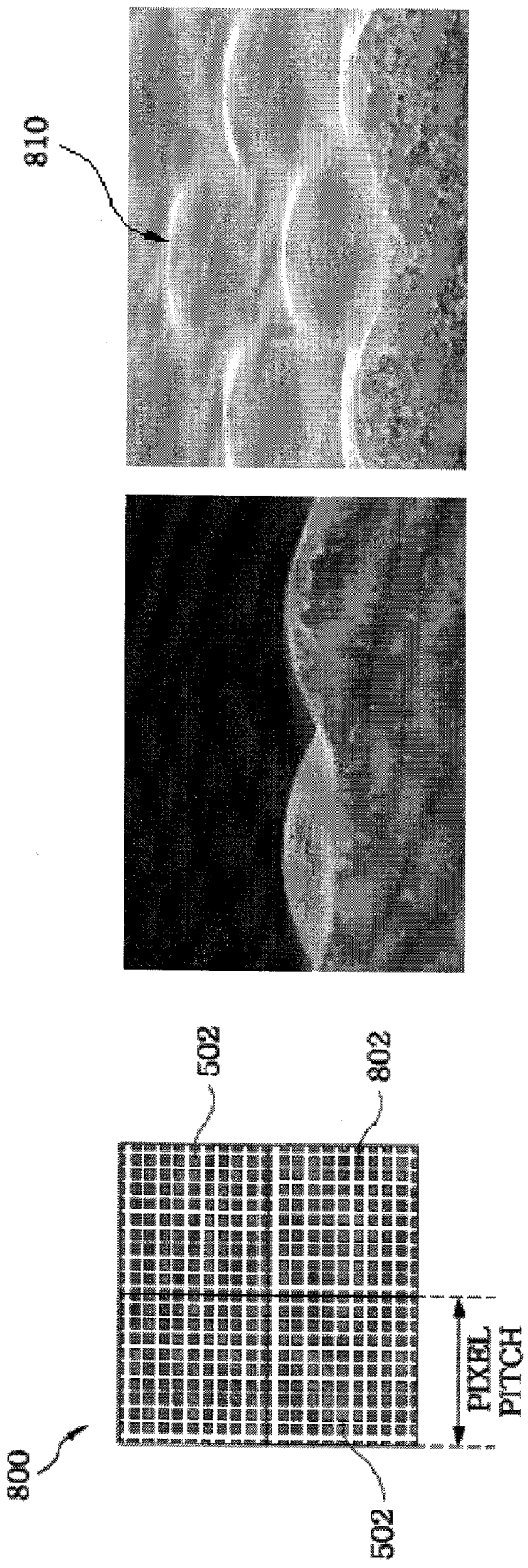

NEGATIVE RESIST EXAMPLE

CONVENTIONAL GRAY DUMMY

GRAY DUMMY FOR VERTICAL SHRINK $x1 < x2 < x3$ $h1 = h2 = h3$ $x4 = x5 = x6$ $h4 < h5 < h6$

METHOD FOR FABRICATING MICRO-LENS, AND MICRO-LENS ARRAY INCLUDING THE MICRO-LENS

The present invention claims priority to Korean Patent Application No. 10-2010-0121266 (filed on Dec. 1, 2010), which is hereby incorporated by reference in its entirety.

BACKGROUND

Generally, thermal reflow is one of the techniques most widely employed in a process for forming a micro-lens array of an image sensor. Thermal reflow applies heat to a photo-resist pattern to reflow it to thus obtain a lens form having a desired curvature.

Use of thermal reflow, however, when a micro-lens in a fluid state comes into contact with a neighbor micro-lens during the reflow process, the micro-lenses in contact tend to conglomerate due to surface tension of the fluid. This makes the micro-lens abruptly bridged with the neighbor micro-lens and the curvature of the bridged micro-lens distorted, which results in a defective micro-lens. Accordingly, the use of the thermal reflow actually makes it difficult to form a perfect zero-gap micro-lens, i.e., without a gap between the micro-lens itself and the neighbor micro-lenses.

FIGS. 1A and 1B illustrate a sequential process of a method for solving the problems in forming the micro-lens and a top-down view of each process in accordance with the related art, respectively.

As illustrated in FIG. 1A, in the related art, in order to solve the bridge problem with the neighboring micro-lens arising in the micro-lens forming process, a photo resist pattern of a first micro-lens is formed and thermally reflowed, and a photo resist pattern of a second micro-lens is then formed in an empty space on a semiconductor substrate and then thermally reflowed, rather than forming the neighboring micro-lens at the same time. Namely, the micro-lens is formed through a 2-step micro-lens forming process or a dual micro-lens forming process.

In such a 2-step micro-lens forming process, the micro-lenses neighboring in a horizontal or vertical direction are formed separately two times, reducing an occurrence of a lens bridge, whereby a perfect zero-gap can be formed.

As illustrated in FIG. 1B, however, when the distance "a" from a micro-lens neighboring in a diagonal direction is zero, a lens bridge is also generated in the diagonal direction. There is a limitation, therefore, in reducing the diameter of the dead zone such that it is less than a certain distance. Meaning, in the general 2-step micro-lens forming process, an adjustable diameter of the dead zone is about 0 nm to 300 nm, which is constant regardless of a pixel pitch. Thus, when the ratio between the pixel area and the dead zone area is taken into consideration, additional improvement is required for pixels having a size of less than 1.4 µm.

Meanwhile, when the size of the pixel is reduced to be 1.2 µm or smaller, optimum lens curvatures of respective red, green, and blue colors should each be different. The existing 2-step micro-lens forming process, however, merely divides the thermal reflow into two steps to simply perform the respective steps separately, and thus, is incapable of forming the respective pixel colors with different curvatures. Accordingly, using this technique it is difficult to achieve optimization due to an increase in the pixel-tech.

In addition, in the above-noted 2-step micro-lens forming process, the lens shape is formed using thermal reflow in both first and second steps of the micro-lens forming process. In such a case, different optimal conditions need to be sought depending on pixel sizes in the thermal reflow. Consequently, there is a problem in that whenever the pixel size is reduced, the optimization process needs to be performed several times, respectively.

As illustrated in FIG. 2, in order to overcome the limitation of the existing thermal reflow, a micro-lens forming process using a gray-tone mask 200 derived from an MEMS (micro electro mechanical systems) process has recently come into prominence. In the micro-lens forming process using the gray-tone mask 200, a mask pattern is formed as if a dot painting was drawn with dots smaller than resolution, to allow the intensity of transmitted light to be continuously changed depending on the density of dots. A desired curvature is thus obtained only with photolithography.

When a micro-lens array is formed by using the gray-tone mask, a desired curvature can be freely formed for each color since the gray-tone mask is mainly dedicated for forming a lens of a pitch of tens of µm of MEMS. In a case of a micro-lens array for an image sensor whose pixel size is merely 1 µm to 2 µm, however, a gap space profile formed between neighboring lenses need to be sharply changed within a distance of about 0.1 µm to 0.2 µm.

The degree of the sharpness of the gap space profile, however, is determined depending on photolithography resolution. As illustrated in FIGS. 3A through 3C, consequently, in a case of photo-resist for a micro-lens using an i-line wavelength, in the micro-lens forming process using the gray-tone mask 310, and an SEM (scanning electron microscope) photograph, a severe gap space rounding 300 is formed to reduce effective curvature of the micro-lens and increase the size of the dead zone at which four lenses are in contact.

SUMMARY

Embodiments relate to an image sensor, and more particularly, to a micro-lens array and a method for fabricating a micro-lens of an image sensor which implements a micro lens array having a zero dead zone in using a gray tone mask in fabricating a micro-lens used for an image sensor, and which generates spherical radiuses of micro-lenses corresponding to respective pixels such that they have different values to thus maximize optical efficiency of colors of the respective pixels.

Embodiments relate to a micro-lens array and a method for fabricating a micro-lens which implements a micro-lens array having a zero dead zone, which is difficult to implement in the existing 2-step micro-lens technique, using a gray-tone mask, while maintaining the same or a reduced number of processes than the related art, which optimizes a lens curvature for each pixel color which is not possible with thermal reflow, and which also effectively prevents formation of a gap space rounding.

Embodiments relate to a micro-lens array and a method for fabricating a micro-lens in which a hybrid 2-step micro-lens forming process in the form of a combination of a gray-tone mask and a thermal reflow process in fabricating micro-lenses is implemented. Accordingly, the problem of designing an additional mask when the curvature of the micro-lens of each pixel is required to be adjusted in the 2-step micro-lens forming process using the gray-tone mask can be resolved. Moreover, the lenses for the respective pixels can be formed with different curvatures.

In accordance with embodiments of the present invention, a method for fabricating a micro-lens includes at least the following: forming a first photo-resist film on and/or over a micro-lens formation area of a semiconductor substrate; forming a portion of the lens formation material layer as a first micro-lens by using a first mask; forming a second photoresist film in a vicinity of the first micro-lens on and/or over the micro-lens formation area; and then forming the second photo-resist film as a second micro-lens using a second mask which is a different type of mask from the first mask.

In accordance with embodiments, the first micro-lens may be formed using a gray-tone mask as the first mask, and the second micro-lens may be formed through a reflow process. Further, the first mask is formed with a transmission area allowing for a transmission of light to the first photo-resist film a blocking area for blocking light, and the density of the blocking area ranges from about 20% to 80%. In addition, the blocking area may be formed of chromium. Also, the curvature radius of the first micro-lens is different from that of the second micro-lens. Moreover, the curvature radius of a horizontal cut face and the curvature radius of a diagonal cut face of the first micro-lens are equal, and the height from a lower layer of the horizontal cut face and the height from a lower layer of the diagonal cut face are different from each other. The first and second micro-lenses may be formed to be adjacent in a vertical or horizontal direction. The first mask may be formed with a transmission area allowing for a transmission of light to the first photo-resist film and a blocking area for blocking light, and the density of the blocking area may range from about 30% to 60%.

The method in accordance with embodiments may further include a step of forming a color filter array before forming the first photo-resist film and/or a step of forming an over-coat layer before forming the first photo-resist film.

In accordance with embodiments of the present invention, a micro-lens array for an image sensor can include at least the following: a first micro-lens; and a second micro-lens adjacent to the first micro-lens and having a curvature radius different from that of the first micro-lens.

In accordance with embodiments, the first and second micro-lenses may be formed to be adjacent in a vertical or horizontal direction. Further, the curvature radius of the horizontal cut face and the curvature radius of the diagonal cut face of the first micro-lens may be equal, and the curvature radius of the horizontal cut face and the curvature radius of the diagonal cut face of the second micro-lens may be different from each other. Also, the micro-lens array may further include a color filter array formed under the first photo-resist film and/or an over-coat layer formed under the first photo-resist film.

DRAWINGS

Figure 4A:
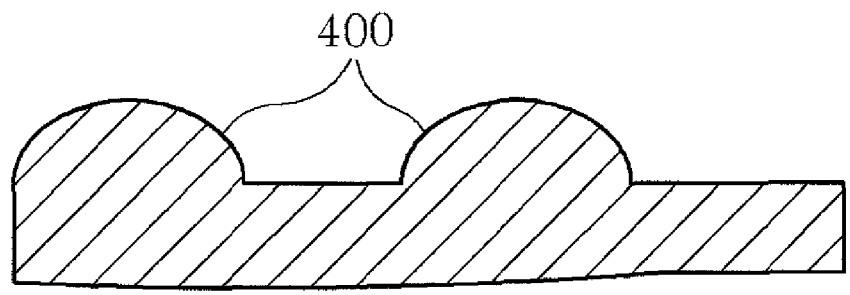
Figure 4B:
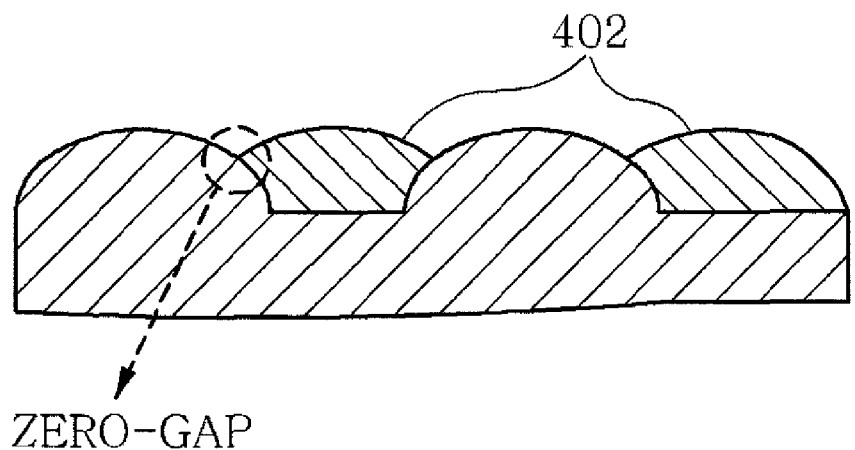

Example FIGS. 4A and 4B illustrate a 2-step micro-lens forming process using a gray-tone mask in accordance with embodiments of the present invention.

Figure 5A:
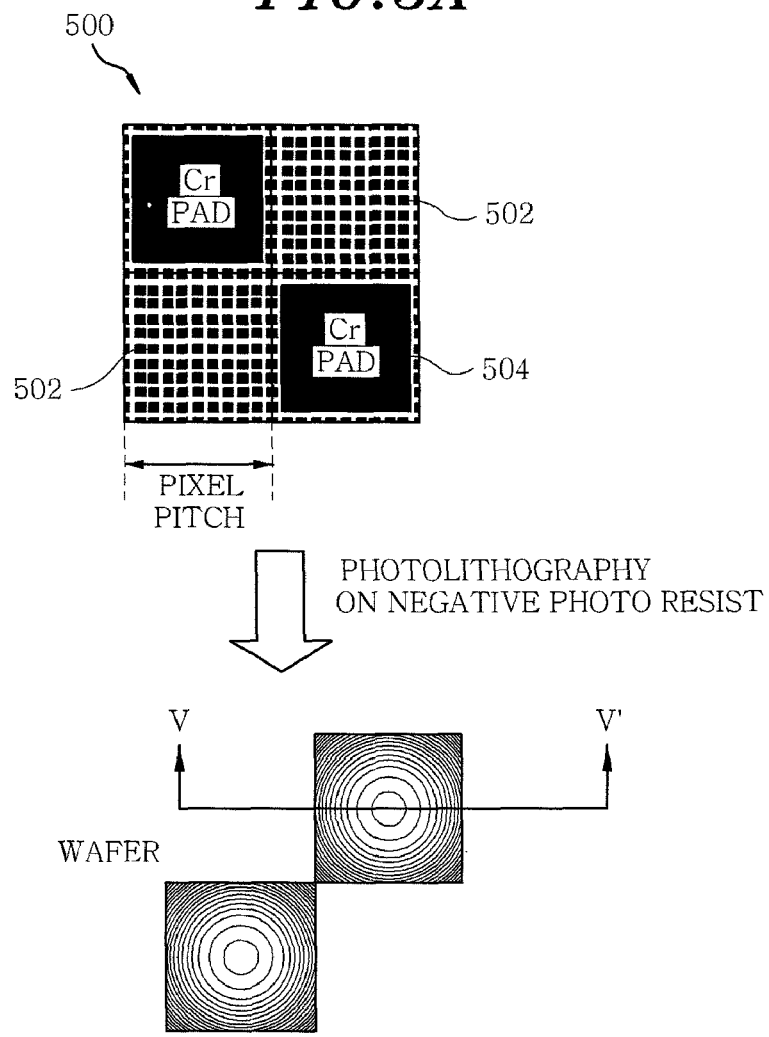

Example FIG. 5A illustrates a formation of a micro-lens using the gray-tone mask in accordance with embodiments of the present invention.

Figure 5B:
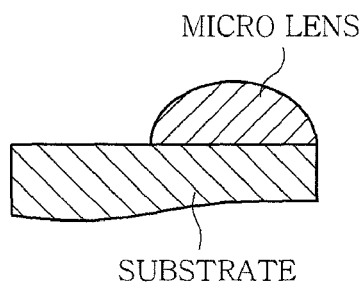

Example FIG. 5B illustrates a cross sectional view of the micro-lens taken along line V-V' illustrated in example FIG. 5A.

Figure 6:
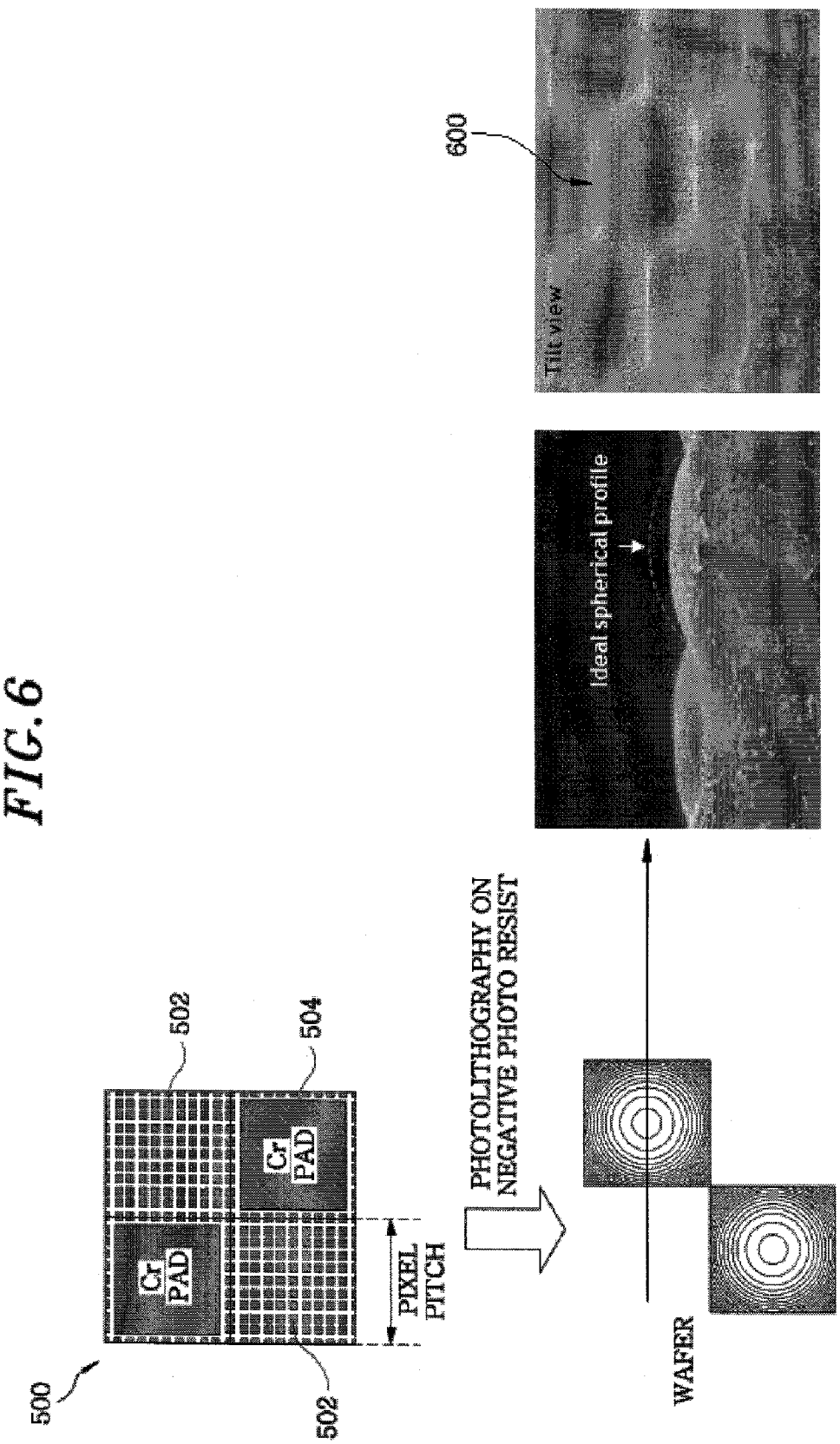

Example FIG. 6 illustrates an SEM photo of a micro-lens profile obtained by the process illustrated in example FIGS. 4A and 4B.

Figure 7A:
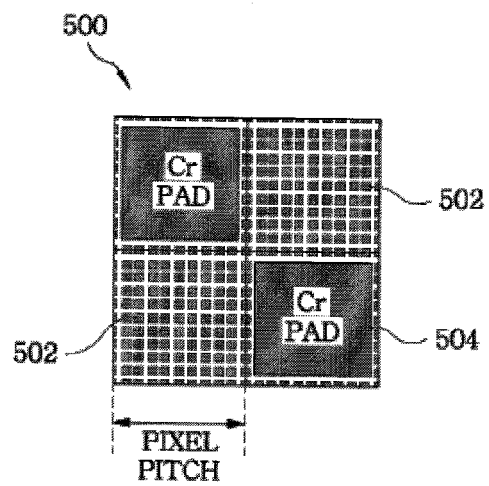
Figure 7B:
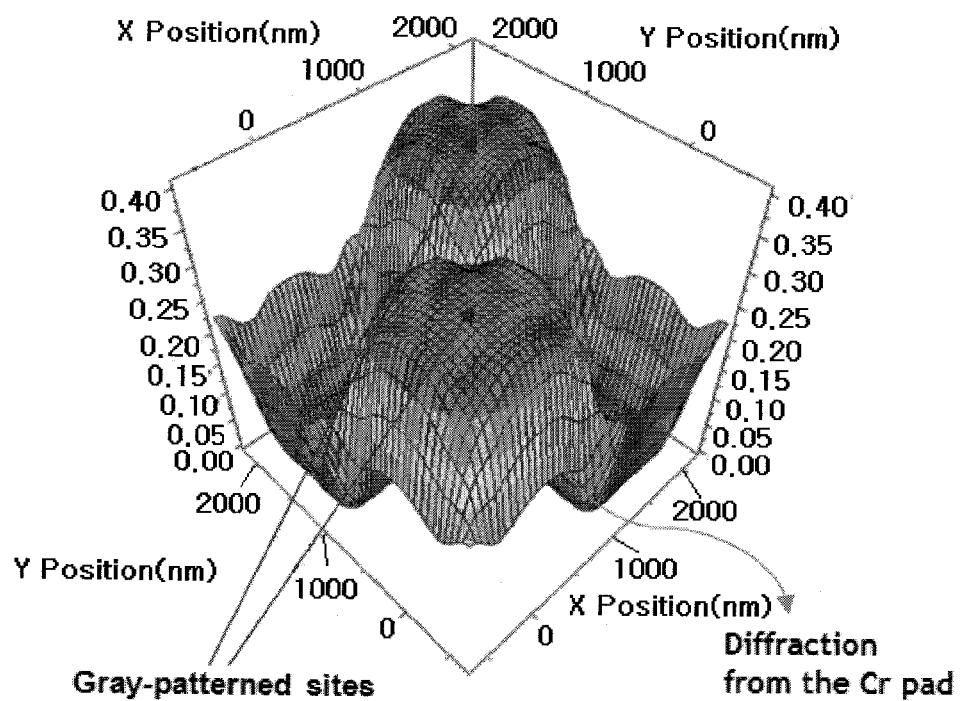

Example FIGS. 7A and 7B illustrate a photomask and an optical simulation graph of the micro-lens profile in example FIG. 6, respectively.

Figure 8A:
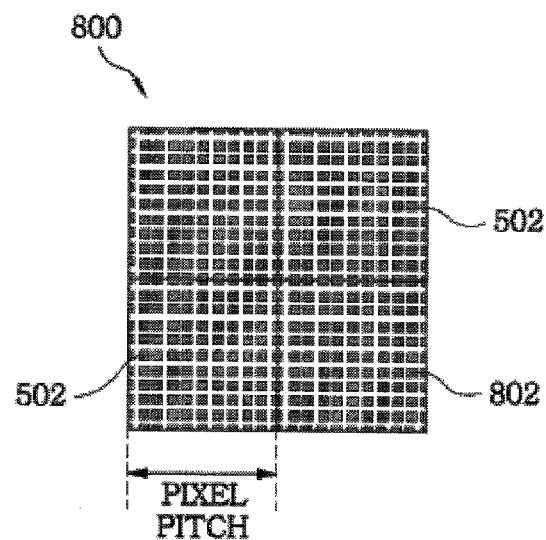
Figure 8B:
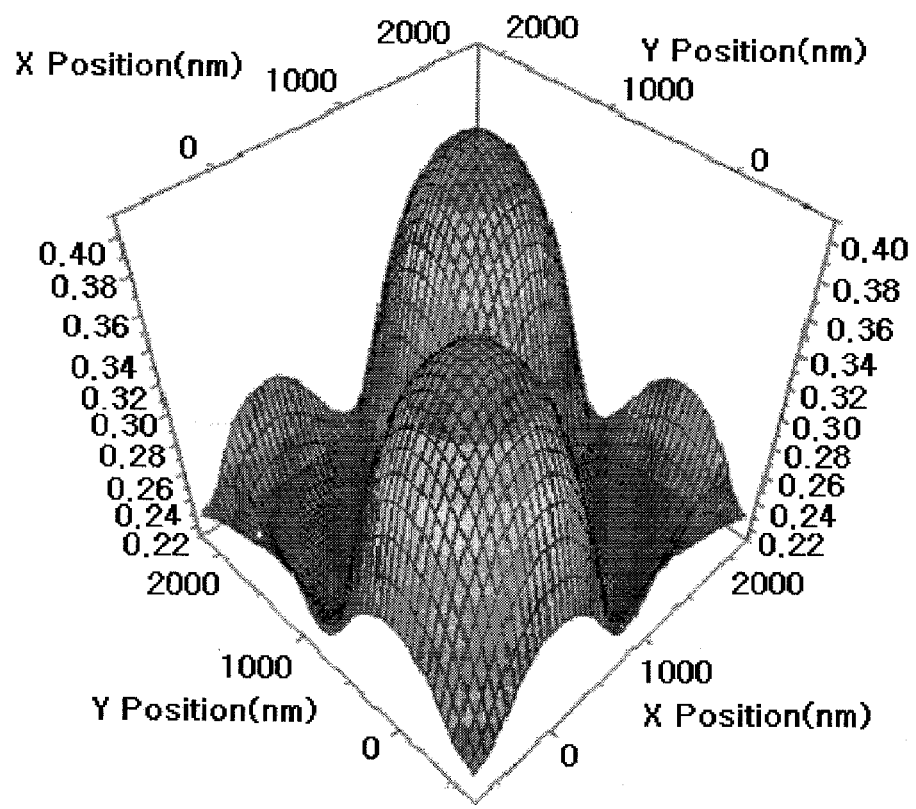

Example FIGS. 8A and 8B illustrate a photo mask having a gray dummy pattern instead of chromium pad illustrated in example FIG. 6 and an optical simulation graph of the micro-lens profile thereof, respectively.

Figure 9:
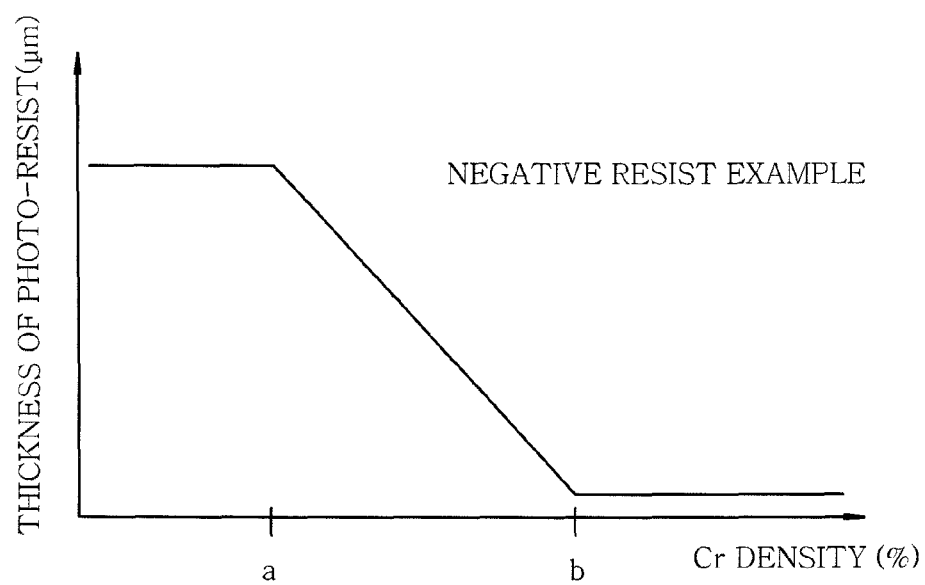

Example FIG. 9 is a graph which illustrates the relationship between a chromium density and thickness of a photo-resist in accordance with embodiments of the present invention.

Figure 10A:
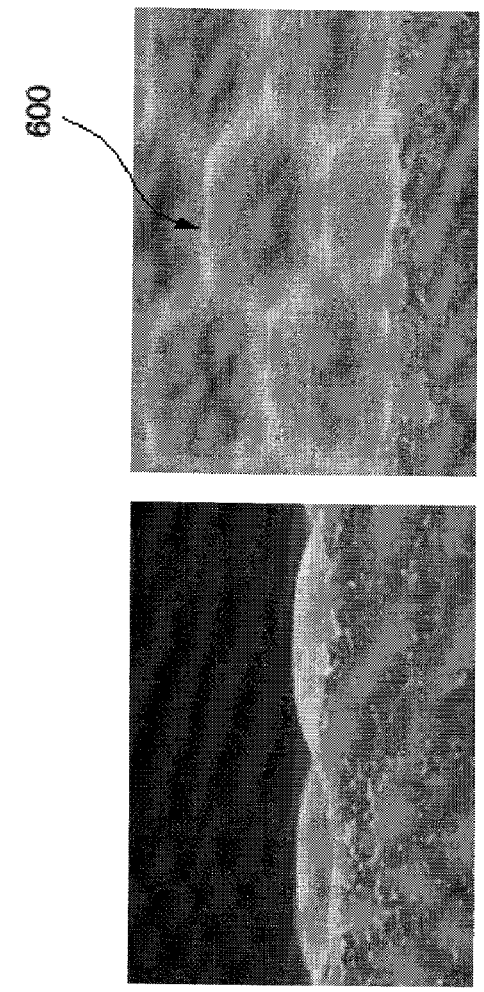
Figure 10A:
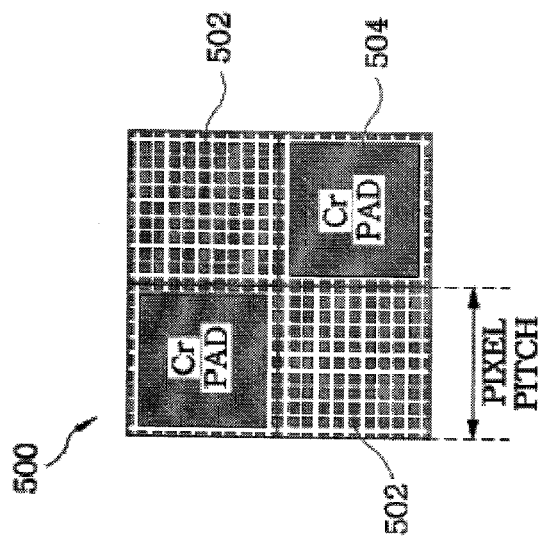

Example FIGS. 10A and 10B illustrate a micro-lens profile achieved by using a photo mask in which the areas where a micro-lens is not formed are formed as the chromium pads, and an enhanced micro-lens profile achieved by using the gray-tone mask in accordance with embodiments of the present invention, respectively.

Figure 11A:
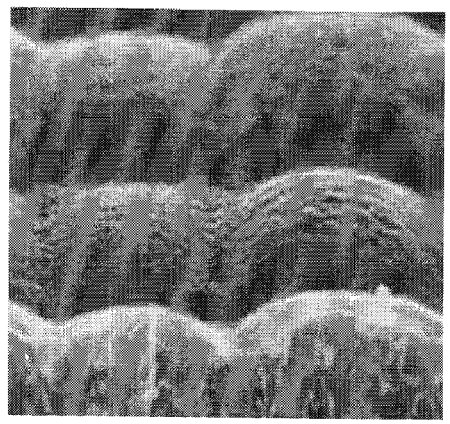
Figure 11B:
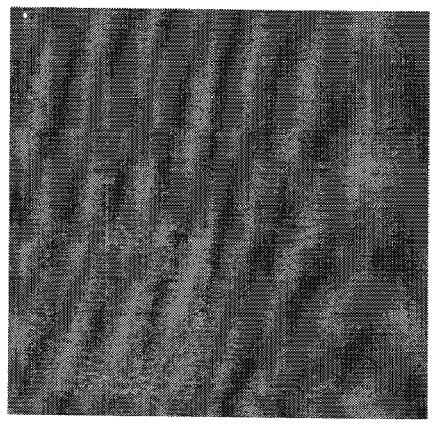

Example FIGS. 11A and 11B respectively illustrate a tilt view and a top view of SEM photographs of micro-lenses using the gray tone mask illustrated in example FIG. 8A.

Figure 12:
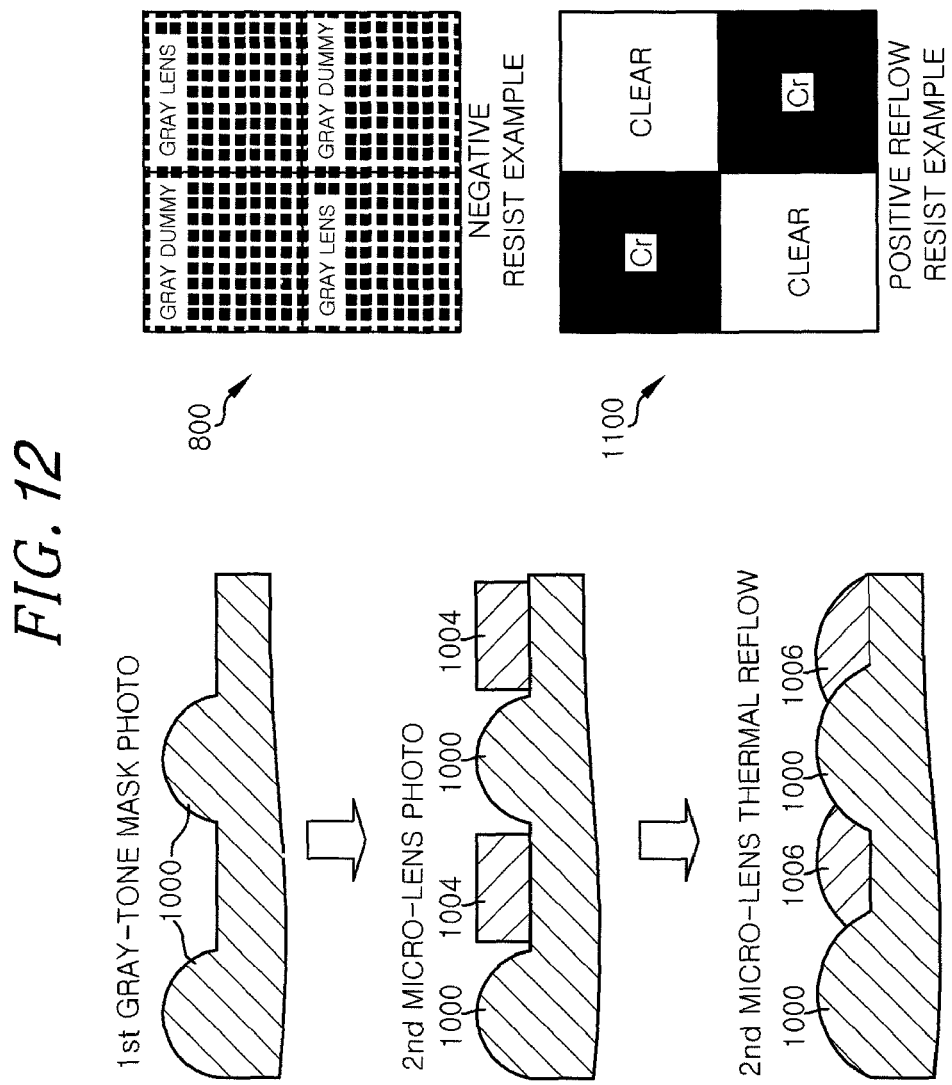

Example FIG. 12 illustrates a hybrid 2-step micro-lens forming process in accordance with embodiments of the present invention.

Figure 13A:
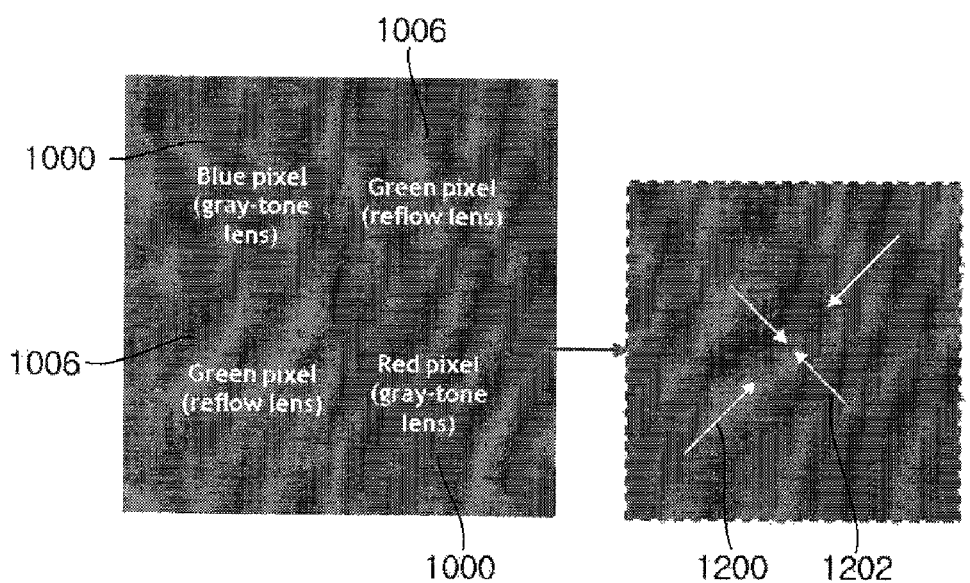
Figure 13B:
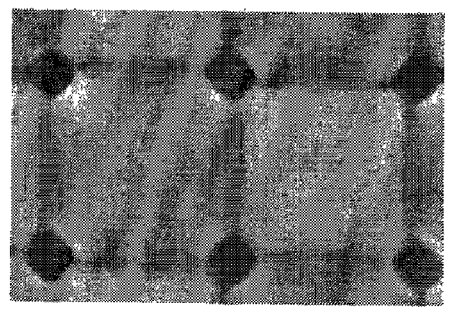

Example FIGS. 13A and 13B illustrate SEM photographs of a micro-lens array implemented by employing the hybrid 2-step micro-lens forming process in accordance with embodiments of the present invention.

Example FIGS. 14A to 14E illustrate a concept of designing a gray-tone mask without the necessity of the over-coat layer in accordance with embodiments of the present invention.

Figure 15A:
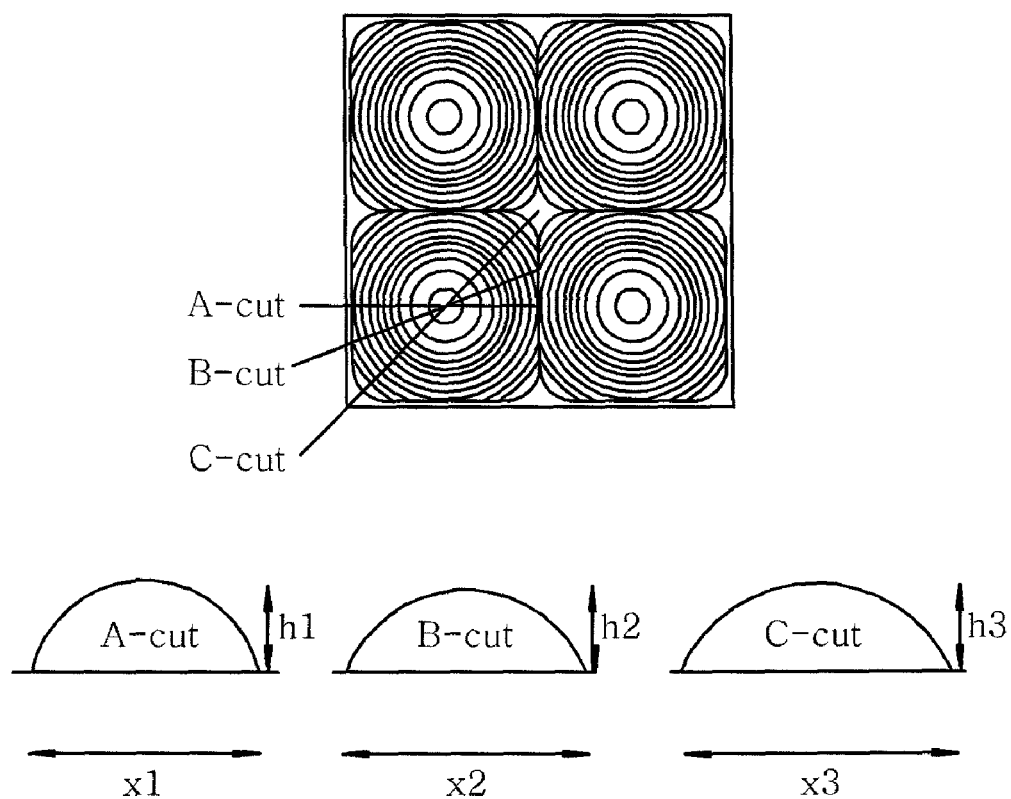
Figure 15B:
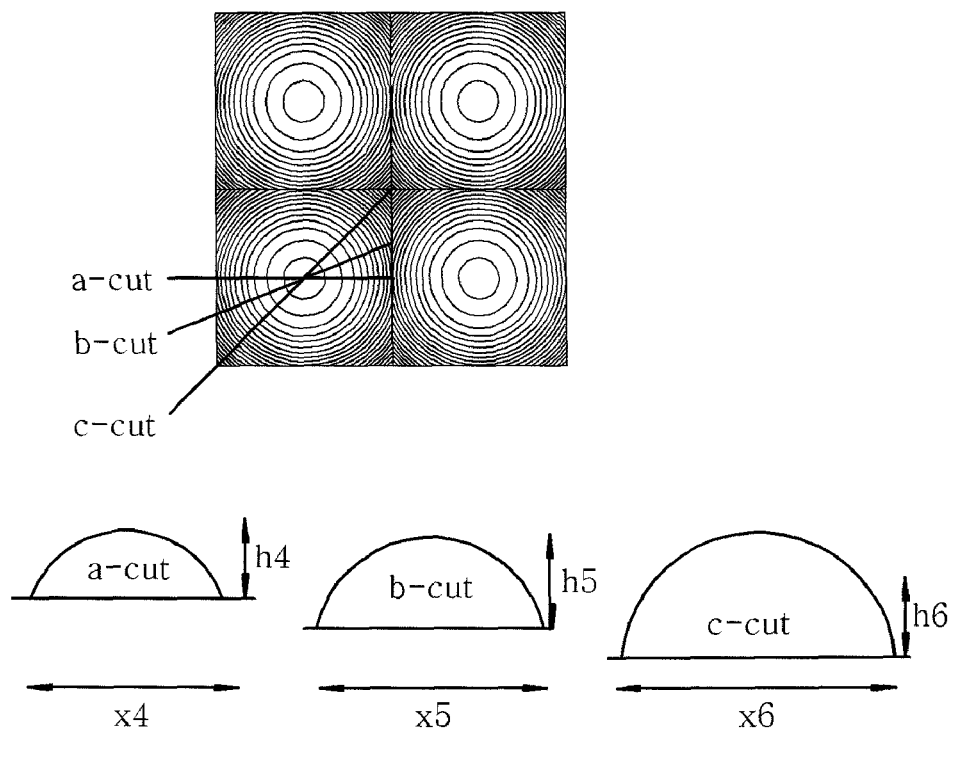

Example FIGS. 15A and 15B respectively illustrate a micro-lens SEM photograph and curvature radius through a thermal reflow process, and the micro-lens SEM photograph and the curvature radius through the gray-tone mask process, in accordance with embodiments of the present invention.

DESCRIPTION

Hereinafter, embodiments of the present invention will be described in detail with reference to the accompanying drawings which form a part hereof. In the following description, well-known functions or constitutions will not be described in detail if they would obscure embodiments of the invention in unnecessary detail. Further, the terminologies to be described below are defined in consideration of functions in accordance with embodiments of the present invention and may vary depending on a user's or operator's intention or practice. The definitions, therefore, need to be understood based on all the contents of the specification.

Example FIGS. 4A and 4B illustrate a 2-step micro-lens forming process using a gray-tone mask in accordance with embodiments of the present invention.

Figure 1A:
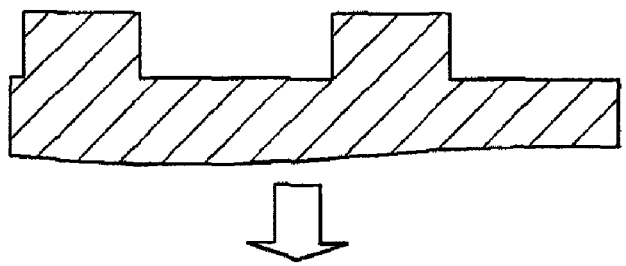
FIGS. 1A and 1B illustrate a 2-step micro-lens forming process using thermal reflow in accordance with the related art.
Figure 1A:
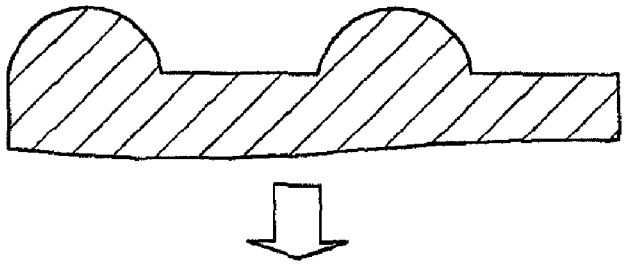
Figure 1A:
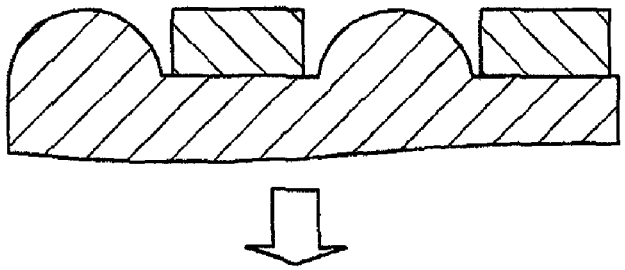
Figure 1A:
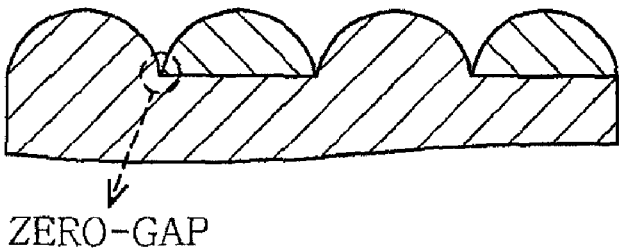
Figure 1B:
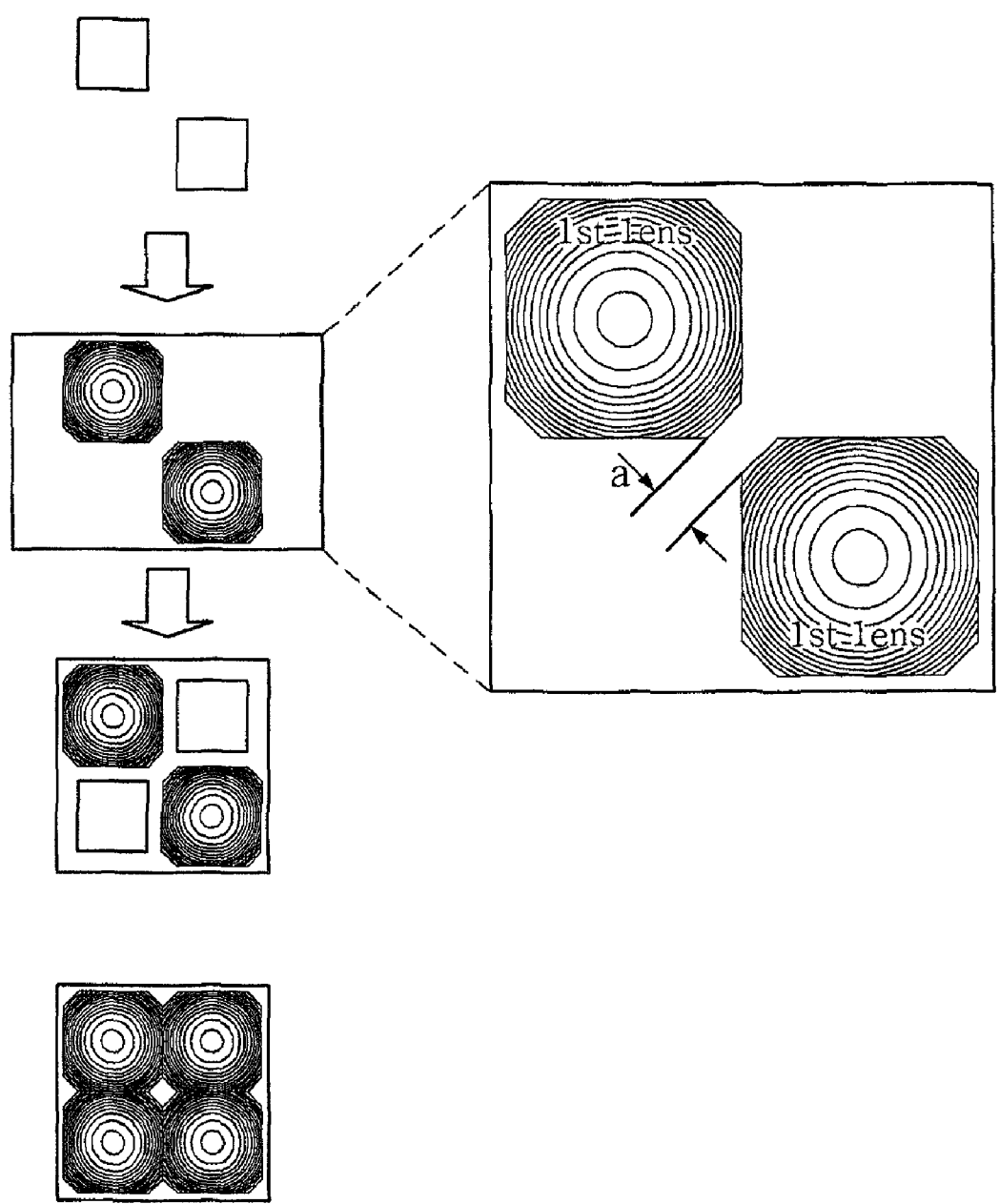
Figure 2:
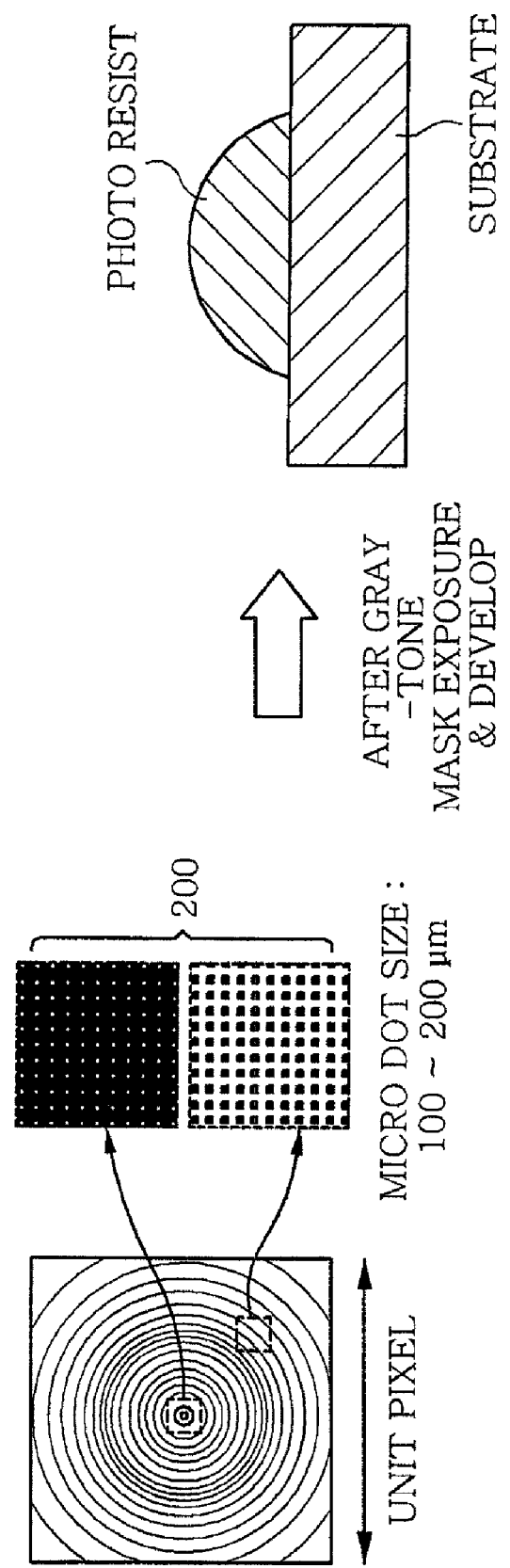
FIG. 2 illustrates a formation of a micro-lens using a gray-tone mask in accordance with the related art.
Figure 3A:
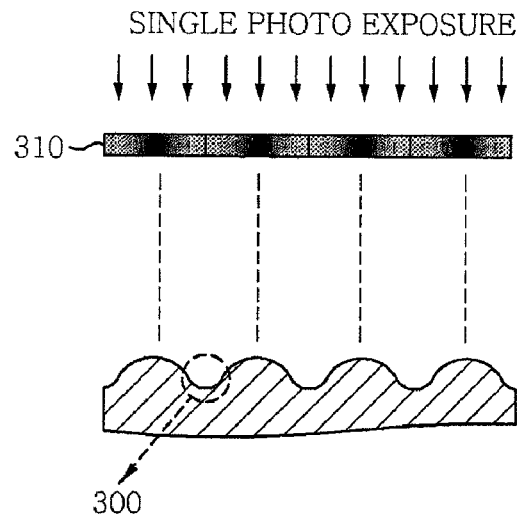
FIGS. 3A to 3C illustrate a process of forming a micro-lens using a gray-tone mask and an SEM photograph in accordance with the related art.
Figure 3B:
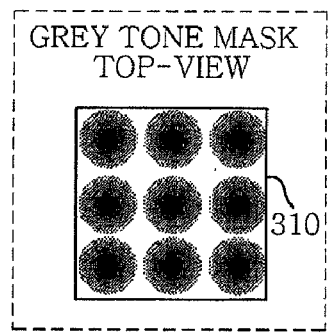
Figure 3C:
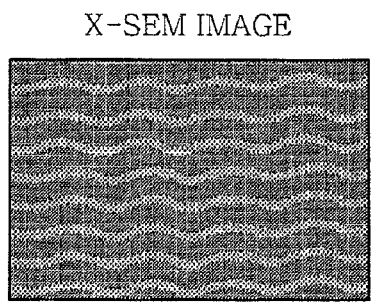

Generally, a lens-to-lens gap profile rounding generated when a micro-lens array is formed by using a gray-tone mask stems from the shortage of resolution in accordance with an exposure wavelength, and thus, can be basically resolved by performing the 2-step micro-lens forming process of FIG. 1A using the gray tone mask illustrated in example FIGS. 4A and 4B.

As illustrated in example FIG. 4A, namely, in the 2-step micro-lens process using the gray tone mask, first micro-lenses 400 are formed using a first gray tone mask on and/or over a semiconductor substrate.

As illustrated in example FIG. 4B, then second micro-lenses 402 are formed using a second gray tone mask in an empty space between the first micro-lenses 400 which have been formed through the first gray tone mask. Thus, a zero gap is achieved between the micro-lenses, thereby implementing zero dead zone micro-lenses.

Example FIG. 5A illustrates an example of a photo mask 500 used in the process of example FIGS. 4A and 4B. Gray tone masks 502 are formed at an area in which a micro-lens array is formed, on and/or over the semiconductor substrate. Blocking films 504 are then formed with chromium (Cr) pads in diagonal areas in which a micro-lens array is not formed to prevent the transmission of light.

After the first micro-lenses are formed on and/or over the photo-resist film applied to the semiconductor substrate using the gray tone masks 502, second gray tone masks are formed in the areas in which the blocking films 504 have been formed with the chromium pads. Blocking films are then formed using the chromium pads in the previous gray tone mask areas. Thereafter, the second micro-lenses are formed in the diagonal areas of the first micro-lenses using the second gray tone masks on and/or over the semiconductor substrate, thereby forming a micro-lens array with a zero dead zone.

As illustrated in example FIGS. 5A and 5B, however, when the micro-lenses are fabricated by completely preventing a light transmission through the blocking films formed with the chromium pads or the like in the areas where a micro-lens is not formed, a conic profile 600 is formed to have a shape similar to a hexahedral shape as if an upper portion of a spherical surface was cut away. This occurs instead of obtaining micro-lenses having an initially anticipated spherical surface, as illustrated in the SEM photograph of example FIG. 6. With such experimentation results, the cause can be estimated through an intensity profile obtained from an optical simulation illustrated in example FIG. 7B.

As illustrated in example FIG. 7A, photo mask 500 includes gray tone masks 502 formed in the area of the semiconductor substrate in which the micro-lens array is formed. The blocking films are then formed with the chromium pads 504 in the diagonal areas in which a micro-lens array is not formed in order to prevent the transmission of light. When light is irradiated to the photo mask 500, light irradiated to the chromium pads 504 is diffracted at the edges of the chromium pads 504 to have an effect that the light is additionally irradiated to the areas of the gray tone masks 502. Accordingly, the intensity profile of light applied to the lower side of the gray tone masks 502 is affected by light diffracted from the areas of the chromium pads 504. This results in the formation of the conic profile in a shape illustrated in example FIG. 7B. When an exposing process, therefore, is performed in the state in which the intensity profile is formed, such an intensity profile is wholly transferred to the photo resist to thereby form the micro-lenses having the conic profile 600 illustrated in the SEM photograph of example FIG. 6.

In order to solve this problem, it is required to prevent the occurrence of the diffraction phenomenon in the chromium pads on the photo mask. As illustrated in example FIG. 8A, in accordance with embodiments of the present invention, therefore, in order to prevent the diffraction by the chromium pads on and/or over the photo mask, the portions in which the chromium pads have been formed on the photo mask 800 are formed as gray dummy masks 802 in the same manner as that of the gray tone masks 502.

In such a case, the gray dummy masks 802 are formed to include certain dummy patterns having a dot size of the resolution or lower of a gray lens site. As illustrated in example FIG. 9, moreover, the density of the dots can be measured by obtaining curved line data representing a change in the thickness of the photo-resist to the change in the mask chromium density.

As illustrated in example FIG. 9, which illustrates the change in the thickness of the photo-resist to the change in the chromium density, it can be seen that the thickness of the photo-resist is linearly changed only in a particular chromium density section between values "a" and "b." Meaning, when the chromium density is less than a value "a," the thickness of the photo-resist is uniform as a maximum value, and when the density is larger than a value "b," the thickness of the photo-resist is uniform as a minimum value. In this case, preferably, value "a" may range from 20% to 30% and value "b" may range from 60% to 80%.

In a case where a negative resist is used for the mask chromium pad illustrated in example FIG. 7A, it serves to prevent a formation of resist as described above. When the chromium density is larger than value "b" in the graph showing the change in the thickness of the photo-resist illustrated in example FIG. 9, therefore, the thickness of the photo-resist may be equal to that of a non-pattern site (or a non-pattern area) in which the chromium pad is present as illustrated in example FIG. 7A. Accordingly, when the gray dummy masks 802 including small gray dots to make the chromium density of value "b" are formed instead of the chromium pads, an intensity level equal to the lowermost intensity level can be formed in the chromium pad areas.

In this manner, when the gray dummy masks 802 including the small gray dots to make the chromium density of value "b" are formed instead of the chromium pads and then subject to an optical simulation, it can be confirmed that the intensity profile of light with respect to the micro-lens formation area is enhanced to be similar to the lens spherical surface expected in the micro-lens pattern as illustrated in example FIG. 8B.

As illustrated in example FIG. 10A, in a case of using the photo mask 500 in which the areas where a micro-lens is not formed are formed as the chromium pads, the diffraction of light generated from the chromium pad areas affects the micro-lens areas to make the micro-lenses formed to have a conic profile 600. On the contrary, in a case of using the photo mask 800 in which the areas where a micro-lens is not formed are formed as the gray dummy masks 802, the diffraction of light is not generated in the areas of the gray dummy masks 802. Consequently, the areas of the micro-lenses are not affected by the diffraction of light, so that the micro-lenses are formed to have the spherical surface shape 810 as anticipated as illustrated in example FIG. 10B.

Considering the foregoing results, when the micro-lenses are implemented by using the 2-step micro-lens forming process using the gray tone mask, if the non-pattern area is mounted with the chromium pad (in case of a negative resist) or with a clear window (in case of a positive resist), the hexahedral conic profile is obtained. Thus, it needs to be necessarily processed with the gray dummy mask, having a certain density, including small dot patterns having the size of about gray dots. In this case, the density of the gray dots in the gray dummy mask can be determined as the chromium density in an area having a minimized thickness of the photo-resist, whereby the minimized thickness of the photo-resist can be experimentally measured through the graph of the thickness of the photo-resist to the change in the chromium density as illustrated in example FIG. 9.

As illustrated in example FIG. 11A, the SEM photographs illustrated confirm that, unlike the existing 2-step micro-lens forming process using the thermal reflow, the four pixels of the respective colors are implemented to have different lens curvatures. This is one of the most important points different from the existing 2-step micro-lens forming process. In case of the micro-lens forming process using the gray tone mask, the optimum curvature of each pixel can be implemented by differentiating the change in the gray dot density on the mask of each pixel.

As illustrated in example FIGS. 11A and 11B, it can be noted that a dead zone in the 2-step micro-lens forming process using the existing thermal reflow is not definite. This is because, a dead zone is formed to have a gentle curvature, rather than having such a punched form as in the existing thermal reflow, due to the characteristics of the micro-lens process using the gray tone mask, thus substantially implementing a zero dead zone.

Example FIG. 12 is a view illustrating a hybrid 2-step micro-lens forming process in accordance with embodiments of the present invention. As described above, the 2-step micro-lens forming process using the gray-tone mask in accordance with embodiments of the present invention, illustrated in example FIGS. 4A and 4B has the advantage in that an optimum lens curvature of each pixel can be determined and implemented when a mask is designed.

Since the curvature or the like of the micro-lens can be considerably adjusted by regulating the thermal reflow condition or the like, however, without replacing the mask in the 2-step micro-lens forming process using the existing thermal reflow, the curvature or the like of the micro-lens can be adjusted when necessary to exhibit better performance even the product is already in the course of manufacturing process. On the other hand, in case of the 2-step micro-lens forming process using the gray-tone mask, if the performance of a product is intended to be enhanced by adjusting the curvature of the micro-lens, the mask needs to be re-designed and fabricated.

Thus, in accordance with embodiments of the present invention, in order to enhance the 2-step micro-lens forming process using the gray-tone mask, a hybrid 2-step micro-lens forming process combining the gray-tone mask and the thermal reflow scheme as illustrated in example FIG. 12 is proposed.

Namely, as illustrated in example FIG. 12, through the hybrid 2-step micro-lens forming process, a first micro-lens 1000 is formed using a gray-tone mask 800, a photoresist pattern 1004 is generated using a photo mask 1100 for a thermal reflow, and then, a second micro-lens 1006 is formed by thermally reflowing the photo resist pattern 1004. When the first micro-lens 1000 formed using the gray-tone mask 800 is formed with blue/red pixel, in case of the blue/red pixel, the curvature can be implemented differently for each color. Then, when the second micro-lens 1006 is formed in two green pixels, it can be implemented to have a third curvature, different from those of the blue/red pixels forming the first micro-lens 1000.

Here, like the case in which the first micro-lens 100 and the second micro-lens 1006 are implemented using the gray-tone mask, the curvatures can be optimized differently for each of the blue/red/green colors, obtaining the same advantages as the 2-step micro-lens forming process using the gray-tone mask proposed in the foregoing embodiment. Further, since the second micro-lens 1006 is formed through thermal reflow, for example, the green pixel can be optimized additionally by adjusting the reflow process conditions, when necessary.

Example FIGS. 13A and 13B illustrate SEM photographs of a micro-lens array implemented by employing the hybrid 2-step micro-lens forming process in accordance with embodiments of the present invention.

As illustrated in example FIG. 13A, although a corner dead zone 1200 having the same level as that in the 2-step micro-lens forming process using the existing thermal reflow is formed between the second micro-lenses 1006 formed through the thermal reflow, a zero dead zone 1202 is formed in a diagonal direction of the first micro-lens 1000 of the blue/red pixels formed by using the gray-tone mask.

Accordingly, it can be confirmed that only the application of the first micro-lens using the gray-tone mask solves the problem in which a dead zone having a limited size even in a small pixel in the 2-step micro-lens forming process using the existing thermal reflow illustrated in example FIG. 13B. Further, when the micro-lens forming process using the gray-tone mask in accordance with embodiments of the present invention is implemented using a photocurable negative photoresist, the micro-lens can have excellent chemical resistance and heat resistance without performing a thermal reflow process. Thus, a final micro-lens can be completed only with general photolithography including applying, exposing and developing operations, thus simplifying the processes. In this case, in order for the implemented structure to properly perform the role of a micro-lens, it is necessary to have a high transmittance of 90% or higher uniformly in a visible light wavelength and its transmittance/absorbance need not to be changed discontinuously in the visible light wavelength.

Figure 14A:
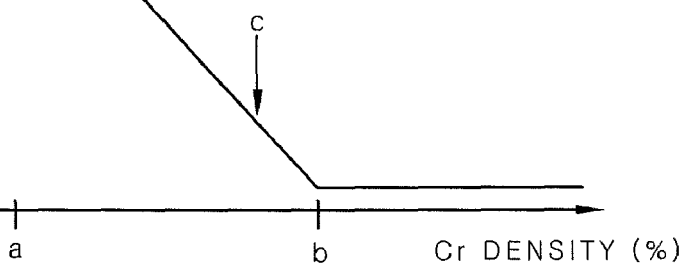
Figure 14B:
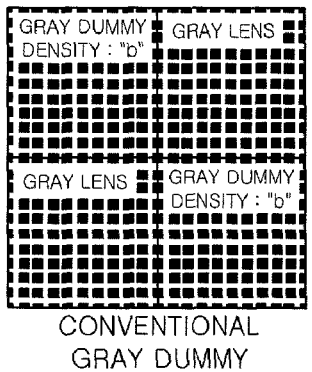
Figure 14C:
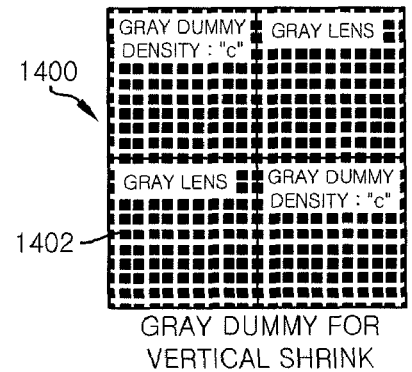
Figure 14D:
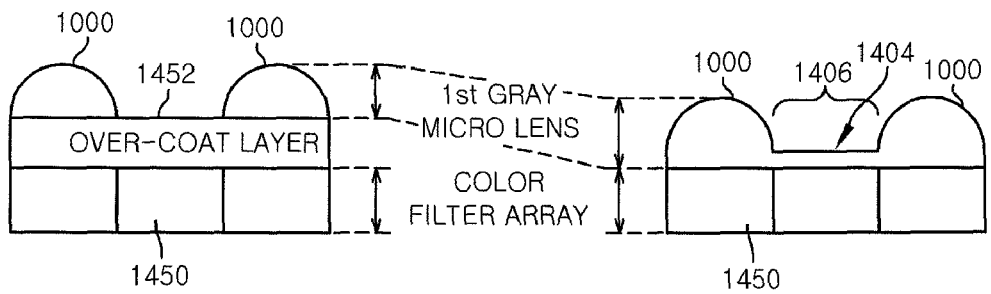

As illustrated in example FIG. 14D, an over-coat layer 1452 is formed with photoresist or the like on and/or over a color filter array 1450, which has been widely used to planarize a step of the color filter array 1450 and protect the color filter array 1450 against a chemical material, moisture or the like used in a packaging process. When the first micro-lenses 1000 are formed using the gray-tone mask illustrated in example FIG. 14B on the over-coat layer 1452, the lower over-coat layer 1452 and the first micro-lenses 1000 are formed by two layers. Accordingly, the step of the micro-lenses is increased.

Thus, in accordance with embodiments of the present invention, the design of the first micro-lenses 100 is adjusted to allow the first micro-lenses 100 to play the role of the over-coat layer 1452, without forming the over-coat layer 1452 on and/or over the color filter array 1450, thus lowering the step of the micro-lenses.

Example FIGS. 14A to 14E are views illustrating the concept of designing the gray-tone mask without the necessity of the over-coat layer 1452 on the color filter array 1450 in accordance with embodiments of the present invention.

Figure 14E:
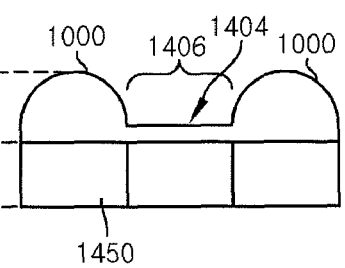

As illustrated in example FIG. 14A, which illustrates the change in the thickness of a photo-resist to the change in a chromium density, in which a gray-tone mask 1400 having a certain thickness of the photo-resist to the chromium density, e.g., "c" is formed as a gray dummy as illustrated in example FIG. 14C, when the first micro-lenses 1000 are formed using the gray-tone mask 1400, a photo-resist 1404 is formed to have a certain thickness previously calculated depending on the chromium density, as illustrated in example FIG. 14E, to cover an area where a gray dummy mask 1402 formed as a gray dummy is positioned.

Namely, as illustrated in example FIG. 14E, when the first micro-lenses 1000 are formed with the photo-resist 1404, which is used for forming the first micro-lenses 1000, using the gray-tone mask 1400 having such a pattern as illustrated in example FIG. 14C, an over-coat layer having a certain thickness is formed at a non-pattern dummy area 1406 where the first micro-lens 1000 is not formed. Namely, the over-coat layer can be formed without performing a separate step of forming the over-coat layer 1452 in advance.

In this case, the thickness of the photo-resist 1404 to be formed at the non-pattern dummy area 1406 can be freely set by adjusting the density of the gray dummy in the gray dummy mask 1402 using the graph showing the relationship between the chromium density and the resist thickness as illustrated in example FIG. 14A. Thus, compared with the conventional case in which the over-coat layer is separately formed, the height of the over-coat layer can be freely reduced, thus implementing a vertical shrink very simply. When the vertical shrink is implemented in this manner, the size of a spot of light concentrated at a lower portion of pixels of an image sensor is proportional to the size of Airy disc [(focal length)×(wavelength)]/[pixel size], so the concentration efficiency can be increased in the fixed pixel size and wavelength to improve the performance of the image sensor.

Example FIGS. 15A and 15B respectively illustrate a micro-lens SEM photograph and curvature radius through a thermal reflow process, and the micro-lens SEM photograph and the curvature radius through the gray-tone mask process in accordance with embodiments of the present invention.

As illustrated in example FIG. 15A, SEM photographs show micro-lenses formed through the thermal reflow process and radiuses of the micro-lenses cut in various directions. The curvature radiuses of the micro-lenses formed through the thermal reflow process depending on a horizontal cut (A-cut), a first diagonal cut (B-cut), and a second diagonal cut (C-cut) are different from one another.

As illustrated in example FIG. 15B, on the other hand, the SEM photographs show the micro-lenses formed through the gray-tone mask process and the radiuses of the micro-lenses cut in various directions. It can be seen that the curvature radiuses of the micro-lenses formed through the gray-tone mask process are uniform although the micro-lenses are cut in any directions. Meaning, as illustrated in example FIG. 15B, it can be seen that the curvature radiuses of the micro-lenses formed through the gray-tone mask process depending on the horizontal cut (a-cut), the first diagonal cut (b-cut), and the second diagonal cut (c-cut) are uniform, but the heights h4, h5, and h6 from the lower layer are different from one another.

As described above, in accordance with embodiments of the present invention, a method for forming a micro-lens of an image sensor includes a gray-tone mask designed using two steps and subject to an exposing process two times to form the micro-lenses. Accordingly, the dead zone can be enhanced compared with that of the micro-lenses formed using the conventional thermal reflow process and the curvature of each pixel of the micro-lenses can be freely adjusted. Further, the formation of the micro-lenses by using the gray-tone mask does not require such a bleaching and hard baking process as in the conventional thermal reflow, simplifying the process.

In addition, in accordance with embodiments of the present invention, since the hybrid 2-step micro-lens forming process in the form of a mixture of the gray-tone mask and the thermal reflow process in fabricating micro-lenses is implemented, the problem of designing a mask again when the curvature of the micro-lens of each pixel is required to be adjusted in the 2-step micro-lens forming process using the gray-tone mask can be resolved. Also, the lenses for the respective pixels can be formed with different curvatures.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for fabricating a micro-lens, the method comprising;
    forming a first photo-resist film on a micro-lens formation area of a semiconductor substrate;
    forming the first photo-resist film as a first micro-lens using a first mask;
    forming a second photo-resist film adjacent to the first micro-lens on the micro-lens formation area; and then
    forming the second photo-resist film as a second micro-lens using a second mask,
    wherein the first mask is formed with a transmission area allowing for a transmission of light to the first photo-resist film and a blocking area for blocking light,
    wherein the blocking area is a gray dummy mask having gray dots,
    wherein a density of the gray dots is determined so that the transmission of the light through the gray dots to portions therebelow is substantially prevented.

2. The method of claim 1, wherein the first micro-lens is formed using a gray-tone mask as the first mask.

3. The method of claim 2, wherein the second micro-lens is formed through a reflow process.

4. The method of claim 1, wherein the density of the gray dots ranges from 60% to 80%.

5. The method of claim 4, wherein the blocking area is formed of chromium.

6. The method of claim 5, wherein the curvature radius of the first micro-lens is different from the curvature radius of the second micro-lens.

7. The method of claim 5, wherein the curvature radius of a horizontal cut face and the curvature radius of a diagonal cut face of the first micro-lens are equal.

8. The method of claim 7, wherein the height from a lower layer of the horizontal cut face and the height from a lower layer of the diagonal cut face are different from each other.

9. The method of claim 5, wherein the first and second micro-lenses are formed to be adjacent in one of a vertical direction and a horizontal direction.

10. The method of claim 5, further comprising:
    forming a color filter array before forming the first photo-resist film.

11. The method of claim 5, further comprising:
    forming an over-coat layer before forming the first photo-resist film.

12. A micro-lens array for an image sensor, the micro-lens array comprising:
    a first micro-lens having a first horizontal cut face and a first diagonal cut face;
    a second micro-lens having a second horizontal cut face and a second diagonal cut face, the second micro-lens being adjacent to the first micro-lens and having a curvature radius different from the curvature radius of the first micro-lens,
    wherein the height from a lower layer of the first horizontal cut face and the height from a lower layer of the first diagonal cut face are different from each other,
    wherein the height from a lower layer of the second horizontal cut face and the height from a lower layer of the second diagonal cut face are equal,
    wherein the first micro-lens is formed using a photo-resist folm and a mask, and the mask is formed with a transmission area allowing for a transmission of light and a blocking area for blocking light,
    wherein the blocking area is a gray dummy mask having gray dots, and wherein a density of the gray dots is determined so that the transmission of the light through the gray dots to portions therebelow is substantially prevented.

13. The micro-lens array of claim 12, wherein the first micro-lens and the second micro-lens are formed to be adjacent in one of a vertical direction and a horizontal direction.

14. The micro-lens array of claim 13, wherein the curvature radius of the first horizontal cut face and the curvature radius of the first diagonal cut face are equal.

15. The micro-lens array of claim 14, wherein the curvature radius of the second horizontal cut face and the curvature radius of the second diagonal cut face are different from each other.

16. The micro-lens array of claim 15, further comprising: a color filter array formed under the first photo-resist film.

17. The micro-lens array of claim 15, further comprising: an over-coat layer formed under the first photo-resist film.

* * * * *